(12) United States Patent
Takahashi et al.

(10) Patent No.: US 11,804,622 B2
(45) Date of Patent: Oct. 31, 2023

(54) ABNORMALITY DETECTION METHOD OF POWER STORAGE DEVICE AND MANAGEMENT DEVICE OF POWER STORAGE DEVICE

(71) Applicant: SEMICONDUCTOR ENERGY LABORATORY CO., LTD., Atsugi (JP)

(72) Inventors: Kei Takahashi, Kanagawa (JP); Toshiyuki Isa, Kanagawa (JP); Ryo Yamauchi, Kanagawa (JP); Koji Kusunoki, Kanagawa (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 109 days.

(21) Appl. No.: 17/253,650

(22) PCT Filed: Jun. 11, 2019

(86) PCT No.: PCT/IB2019/054837
§ 371 (c)(1),
(2) Date: Dec. 18, 2020

(87) PCT Pub. No.: WO2019/243950
PCT Pub. Date: Dec. 26, 2019

(65) Prior Publication Data
US 2021/0257681 A1   Aug. 19, 2021

(30) Foreign Application Priority Data
Jun. 22, 2018 (JP) .................... 2018-118987

(51) Int. Cl.
G01R 31/00 (2006.01)
H01M 10/48 (2006.01)
(Continued)

(52) U.S. Cl.
CPC ...... *H01M 10/482* (2013.01); *G01R 31/3835* (2019.01); *H01M 10/0525* (2013.01);
(Continued)

(58) Field of Classification Search
CPC ........... H01M 10/482; H01M 10/0525; H01M 10/325; G01R 31/3835
(Continued)

(56) References Cited

U.S. PATENT DOCUMENTS 6,034,506 A   3/2000  Hall
6,828,757 B2  12/2004 Furukawa
(Continued)

FOREIGN PATENT DOCUMENTS

CN   101022180 A   8/2007
CN   102243524 A   11/2011
(Continued)

OTHER PUBLICATIONS

International Search Report (Application No. PCT/IB2019/054837) dated Sep. 17, 2019.
(Continued)

*Primary Examiner* — Vincent Q Nguyen
(74) *Attorney, Agent, or Firm* — NIXON PEABODY LLP; Jeffrey L. Costellia

(57) ABSTRACT

The cost of hardware and the cost of calculation are reduced in the case where a plurality of assembled batteries are used. The amount of change in the voltage of each battery constituting an assembled battery is sequentially measured with a voltage monitor and abnormality is detected from the correlation between the amounts of changes in the voltages of batteries at the same period. Furthermore, abnormality is detected on the basis of the amounts of changes up to the previous step. Inference is made by a reference parameter acquisition system using an IIR filter or an FIR filter.

9 Claims, 9 Drawing Sheets

(51) Int. Cl.
*G01R 31/3835* (2019.01)
*H01M 10/0525* (2010.01)
*H01M 10/42* (2006.01)

(52) U.S. Cl.
CPC ......... *H01M 10/425* (2013.01); *H01M 10/48* (2013.01); *H01M 2010/4271* (2013.01)

(58) Field of Classification Search
USPC ........................................ 324/426, 432–435
See application file for complete search history.

(56) References Cited

U.S. PATENT DOCUMENTS

| | | | |
|---|---|---|---|
| 7,471,068 | B2 | 12/2008 | Cegnar |
| 7,675,266 | B2 | 3/2010 | Nakano et al. |
| 7,999,511 | B2 | 8/2011 | Umetsu |
| 8,103,401 | B2 | 1/2012 | Kubo et al. |
| 8,581,557 | B2 | 11/2013 | Kanab et al. |
| 8,754,654 | B2 | 6/2014 | Furukawa |
| 8,874,393 | B2 | 10/2014 | Nagai et al. |
| 8,878,492 | B2 | 11/2014 | Furukawa et al. |
| 8,999,576 | B2 | 4/2015 | Ohira et al. |
| 9,203,478 | B2 | 12/2015 | Saito |
| 9,340,122 | B2 | 5/2016 | Yamauchi et al. |
| 9,490,646 | B2 | 11/2016 | Kubota et al. |
| 9,564,767 | B2 | 2/2017 | Takahashi et al. |
| 10,267,863 | B2 | 4/2019 | Heiries et al. |
| 10,386,419 | B2 | 8/2019 | Kanai et al. |
| 10,468,892 | B2 | 11/2019 | Park |
| 10,891,869 | B1 | 1/2021 | Mcintosh et al. |
| 2001/0005125 | A1 | 6/2001 | Nagai et al. |
| 2004/0126635 | A1 | 7/2004 | Pearson |
| 2006/0092583 | A1 | 5/2006 | Alahmad et al. |
| 2007/0188133 | A1 | 8/2007 | Nakano et al. |
| 2010/0209771 | A1 | 8/2010 | Shizuka et al. |
| 2010/0261048 | A1 | 10/2010 | Kim et al. |
| 2011/0282604 | A1 | 11/2011 | Nagai et al. |
| 2011/0307733 | A1 | 12/2011 | Tokunaga |
| 2012/0034526 | A1 | 2/2012 | Kurahashi |
| 2012/0133310 | A1 | 5/2012 | Lee |
| 2012/0161709 | A1 | 6/2012 | Fujii et al. |
| 2012/0274140 | A1 | 11/2012 | Ganor |
| 2012/0286578 | A1 | 11/2012 | Uno et al. |
| 2012/0313439 | A1 | 12/2012 | Yamaguchi et al. |
| 2013/0162197 | A1 | 6/2013 | Takahashi et al. |
| 2013/0234672 | A1 | 9/2013 | Kubota et al. |
| 2013/0261043 | A1 | 10/2013 | Bello et al. |
| 2014/0152261 | A1 | 6/2014 | Yamauchi et al. |
| 2016/0103184 | A1 | 4/2016 | Kawai et al. |
| 2017/0276734 | A1 | 9/2017 | Heiries et al. |
| 2017/0317374 | A1 | 11/2017 | Takahashi |
| 2018/0340980 | A1 | 11/2018 | Roettinger |
| 2019/0120908 | A1* | 4/2019 | Naha .................... G01R 31/367 |
| 2019/0242950 | A1 | 8/2019 | Kishi |
| 2019/0245252 | A1* | 8/2019 | Mäki ..................... B60L 3/0069 |
| 2020/0091732 | A1 | 3/2020 | Park |
| 2021/0055352 | A1* | 2/2021 | Takahashi ............. H01M 10/48 |

FOREIGN PATENT DOCUMENTS

| | | |
|---|---|---|
| CN | 103221835 A | 7/2013 |
| CN | 106654405 A | 5/2017 |
| DE | 102017208770 | 11/2018 |
| EP | 2642307 A | 9/2013 |
| EP | 3162609 A | 5/2017 |
| EP | 3270173 A | 1/2018 |
| IN | 2017/41037852 | 10/2017 |
| IN | 2017/41037852 | 7/2018 |
| JP | 2007-240523 A | 3/2007 |
| JP | 2011-238570 A | 11/2011 |
| JP | 2012-122787 A | 6/2012 |
| JP | 2015-112007 A | 6/2015 |
| JP | 2016-080693 A | 5/2016 |
| JP | 2017-092028 A | 5/2017 |
| JP | 2018-506017 | 3/2018 |
| WO | WO-2016/143679 | 9/2016 |
| WO | WO-2018/012151 | 1/2018 |

OTHER PUBLICATIONS

Written Opinion (Application No. PCT/IB2019/054837) dated Sep. 17, 2019.

* cited by examiner

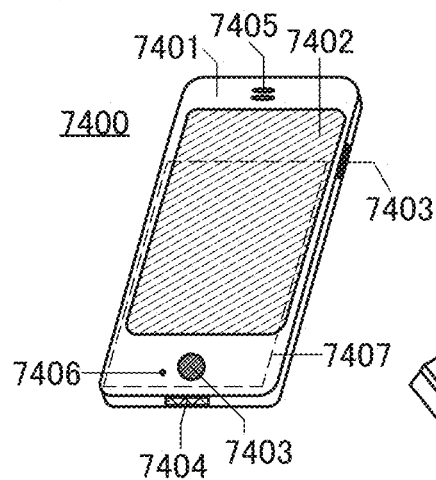
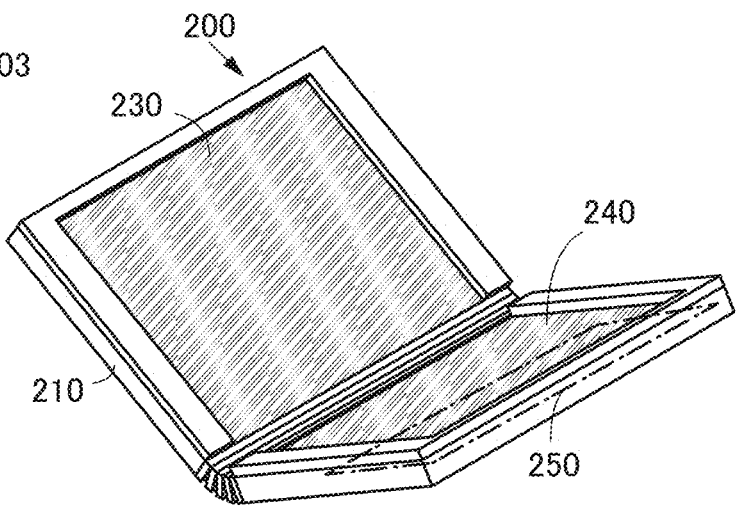
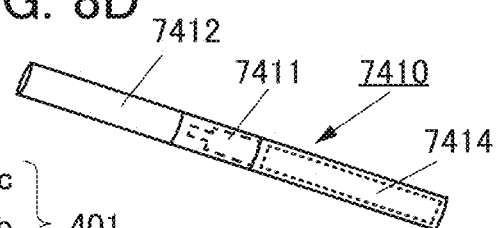
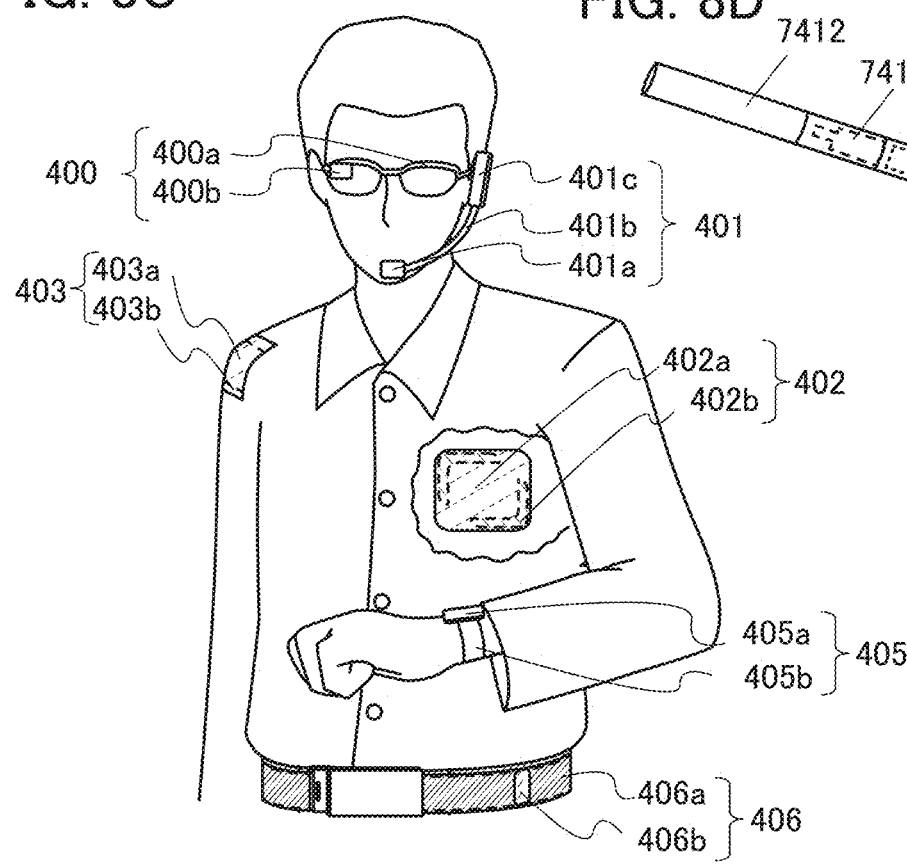

ABNORMALITY DETECTION METHOD OF POWER STORAGE DEVICE AND MANAGEMENT DEVICE OF POWER STORAGE DEVICE

TECHNICAL FIELD

One embodiment of the present invention relates to an object, a method, or a manufacturing method. One embodiment of the present invention relates to a process, a machine, manufacture, or a composition of matter, One embodiment of the present invention relates to a semiconductor device, a display device, a light-emitting device, a power storage device, a lighting device, or an electronic device. One embodiment of the present invention relates to a method for estimating the charge state of a power storage device, and a method for managing the charge of a power storage device. In particular, the present invention relates to a charge state estimation system of a power storage device, a charging system of a power storage device, and a management system of a power storage device (also referred to as a BMS, battery management system).

Note that a power storage device in this specification refers to every element and device having a function of storing electric power. For example, a storage battery (also referred to as a secondary battery) such as a lithium-ion secondary battery, a lithium-ion capacitor, a nickel hydrogen battery, an all-solid-state battery, and an electric double layer capacitor are included in the category of the power storage device.

One embodiment of the present invention elates to a neural network and a management device of a power storage device using a neural network, One embodiment of the present invention relates to a vehicle including a BMS using a neural network. One embodiment of the present invention relates to an electronic device using a neural network. One embodiment of the present invention is not limited to a vehicle, and can also be applied to a power storage device for storing electric power obtained from power generation facilities such as a solar power generation panel provided in a structure body or the like.

BACKGROUND ART

As a method for estimating the remaining capacity of a secondary battery, a Coulomb counter method or an OCV (Open Circuit Voltage) method is used.

Conventional methods have a problem in that with repeated charge and discharge during a long-tem operation, errors are accumulated to significantly decrease the estimation accuracy of a charge rate, i.e., SOC (State of Charge). In addition, when a battery remains unused, an initial SOC(0) changes due to self-discharge, which makes it difficult to increase the SOC estimation accuracy. The Coulomb counter method is disadvantageous in that, for example, an error of the initial SOC(0) cannot be corrected and errors of a current sensor are accumulated. Patent Document 1 discloses a technique for highly accurate estimation of the state of a secondary battery at a low temperature by a state estimation means based on data having a parameter associated with temperature.

REFERENCE

Patent Document

[Patent Document 1]
Japanese Published Patent Application No. 2016-80693

SUMMARY OF THE INVENTION

Problems to be Solved by the Invention

A secondary battery using lithium ions is known to exhibit thermal runaway with internal short-circuit, overdischarge, or the like due to degradation. Abnormality that is a sign of thermal runaway needs to be detected so that safety measures can be taken.

The SOC estimation accuracy might significantly decrease as degradation of the secondary battery proceeds. Note that the SOC is defined as the proportion of remaining capacity to the maximum capacity of the secondary battery. When the maximum capacity of the secondary battery is calculated from a time integral of current in discharge after full charge, it might take a long time to complete discharge.

In a portable information terminal, an electric vehicle, or the like, a plurality of secondary batteries are connected in series or in parallel and a protective circuit is provided, which are collectively used as a battery pack (also referred to as an assembled battery). A battery pack refers to a container (a metal can or a film exterior body) in which a battery module composed of a plurality of secondary batteries and a predetermined circuit are stored for easy handling of secondary batteries. The battery pack includes an ECU (Electronic Control Unit) in order that the operation state can be managed. If a plurality of secondary batteries constituting a battery pack (an assembled battery) have variations in characteristics, the balance is disturbed. A secondary battery with disturbed balance is excessively charged or not fully charged in charging, so that the apparent capacity decreases as a whole.

In the case where n. (n is an integer of 3 or more) secondary batteries are used in a vehicle such as an electric vehicle, n pieces of hardware and n times of calculation using the hardware are necessary for monitoring the state of each secondary battery and detecting abnormality. Hence, the use of a larger number of secondary batteries increases the cost of hardware and the cost of calculation.

The cost of hardware and the cost of calculation are reduced in e case where a plurality of assembled batteries are used.

In an electric-powered vehicle that requires a large amount of electric power, a plurality of switching elements are connected to a power source and the like, and an electromagnetic noise is generated when the on/off state of each switching element is changed. The electromagnetic noise refers to an electromagnetic radiation that is generated by a high-frequency current induced by a transient current due to a switching operation. Conduction of an electromagnetic noise includes conduction through a conductor and conduction through a space, and the electromagnetic noise becomes larger as electric power increases. A shield is sometimes provided in order to block the conduction of an electromagnetic noise through a space; however, the blocking is difficult because there are various types of electromagnetic noises. The electromagnetic noise is a strong noise for a short period of time (a spike-like noise, a burst-like noise, or a monopulse noise). Noises generated from different sources sometimes overlap to become a large electromagnetic noise. A large electromagnetic noise might cause electromagnetic interference (EMI) that influences the operation of other devices through a power supply line or the like, leading to, for example, malfunction of a circuit.

A plurality of electromagnetic noises are sometimes added in a circuit to increase the amplitude or the like of the electromagnetic noise. When the electromagnetic noise is input to a battery management system, a power storage device that operates normally might be regarded as an abnormal power storage device.

Means for Solving the Problems

The amount of change in the voltage of each battery constituting an assembled battery is sequentially measured with a voltage monitor and abnormality is detected from the correlation between the amounts of changes in the voltages of batteries at the same period. Furthermore, abnormality is detected on the basis of the amounts of changes up to the previous step.

Specifically, normalization is performed with the slope of the voltage of a given battery. On the basis of the correlation (e.g., the magnitude relationship) between the slopes of voltages of batteries without abnormality, a battery is determined to be abnormal when deviating from the range of variations in the characteristics of batteries.

The voltage of each of secondary batteries connected in series is monitored and the slope of a graph whose vertical axis and horizontal axis represent an observed voltage and time, respectively, that is, the amount of change in voltage per unit time, is compared between batteries; then, the correlation (the same tendency) is observed when there is no abnormality. In the case where a battery has abnormality, it has a poor correlation with other batteries. As a result, an abnormal secondary battery can be found by monitoring the correlation between the slopes of batteries.

The slope of the voltage of a given battery is normalized in order to quantify the correlation. The slope of the voltage of a battery largely depends on the internal impedance. On the basis of the relative relationship between the slopes of voltages of batteries, a battery is determined to be abnormal when deviating from the range of variations in the characteristics of batteries.

The relative relationship between the slopes of voltages of batteries acquires a reference parameter using feedback control. A plurality of secondary batteries fabricated in the same fabrication process have substantially the same reference parameters in the initial state; as degradation proceeds, a difference between the reference parameters is generated and gradually increased.

In comparison with the threshold value determined on the basis of the reference parameter, an observed signal with the observed voltage having a slope less than or equal to the threshold value is regarded as a noise and the battery is determined to be normal. In the case where the observed voltage has a slope significantly different from the threshold value and beyond an expected range, the battery is determined to be abnormal. The coefficient is updated on the basis of data of the secondary battery determined to be normal and feedback is provided.

In an abnormality detection method disclosed in this specification, a plurality of secondary batteries connected in series are measured with a voltage monitor and the amounts of changes in the voltages of the secondary batteries per unit time are compared; then, a secondary battery with a poor correlation among the plurality of secondary batteries is determined to be abnormal.

In the aforementioned abnormality detection method, the secondary battery is a lithium-ion secondary battery. The correlation between the amounts of changes in the voltages of the secondary batteries is normalized on the basis of a given secondary battery.

In the aforementioned abnormality detection method, the correlation between the amounts of changes in the voltages of the secondary batteries uses a reference parameter obtained using an IIR filter. Alternatively, the correlation between the amounts of changes in the voltages of the secondary batteries uses a reference parameter obtained using an FIR filter.

Effect of the Invention

A lithium-ion secondary battery incorporated in a vehicle, a device, or the like can be detected to be abnormal or pre-abnormal before stopping supplying electric power due to malfunction, so that a user can be prompted to take an appropriate measure.

The abnormality such as thermal runaway of a secondary battery can be prevented from occurring by detecting a micro-short circuit.

In addition, the amount of calculation can be reduced compared with the case of using a Kalman filter, so that the SOC estimation and the abnormality detection can be performed at low costs.

BRIEF DESCRIPTION OF THE DRAWINGS

FIGS. 8 (A), (B), (C), and (D) are perspective views showing examples of devices.

MODE FOR CARRYING OUT THE INVENTION

Hereinafter, embodiments of the present invention will be described in detail with reference to the drawings. Note that the present invention is not limited to the following description, and it will be readily understood by those skilled in the art that modes and details of the present invention can be modified in various ways. In addition, the present invention should not be construed as being limited to the description of embodiments below.

Embodiment 1

Figure 1:
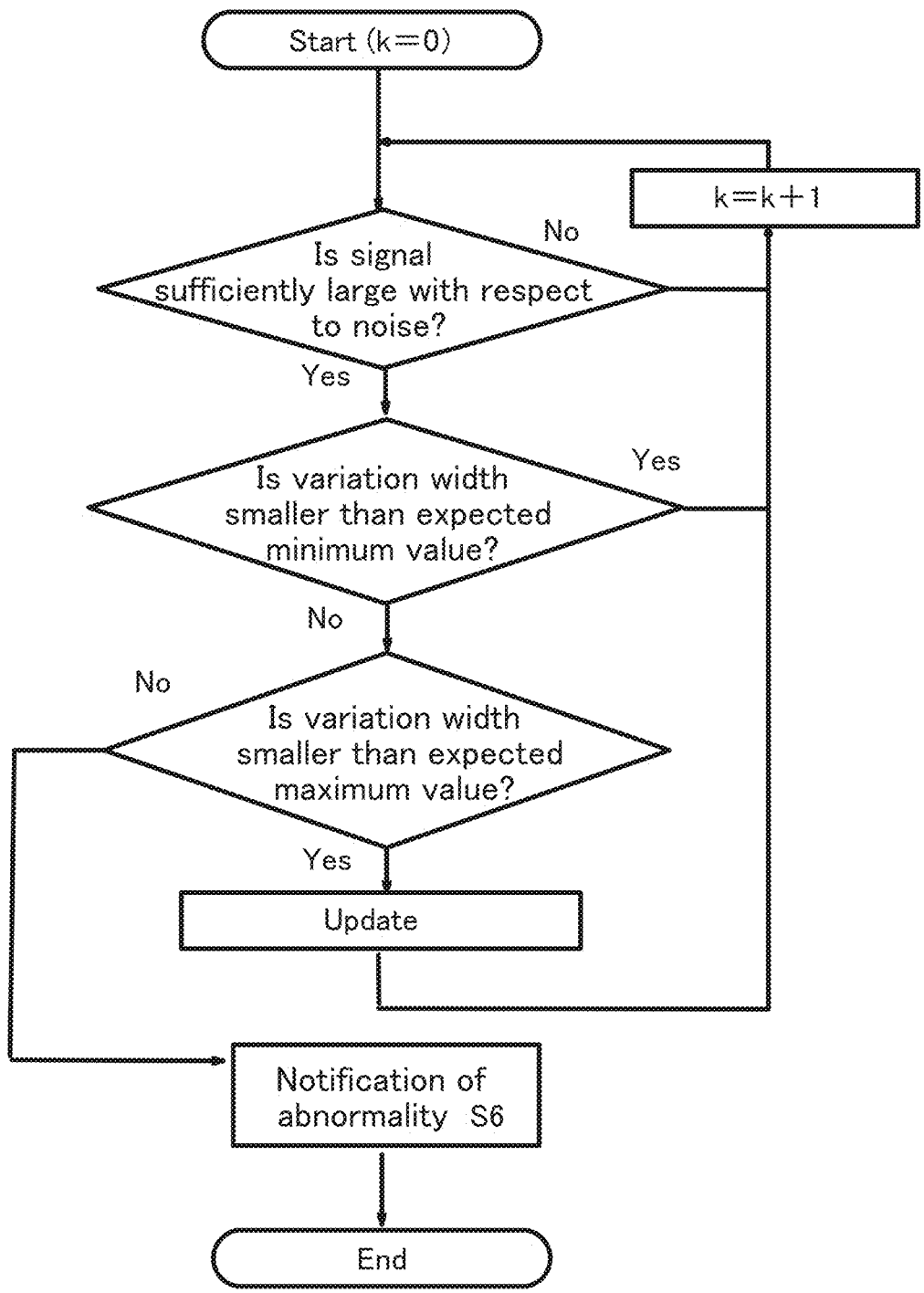
FIG. 1 A flow chart showing one embodiment of the present invention.

FIG. 1 shows an example of a flow chart of the invention disclosed in this specification.

Figure 2A:
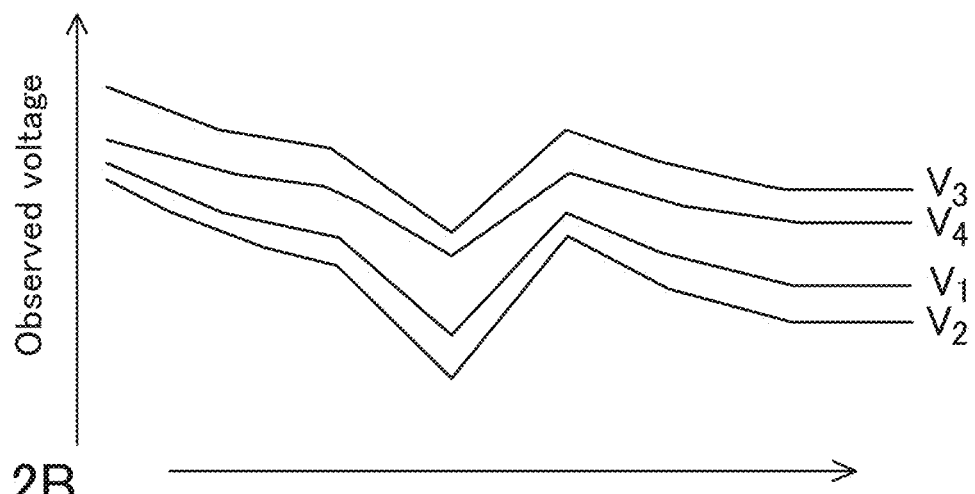
FIGS. 2 (A), (B), and (C) are graphs showing one embodiment of the present invention.
Figure 2B:
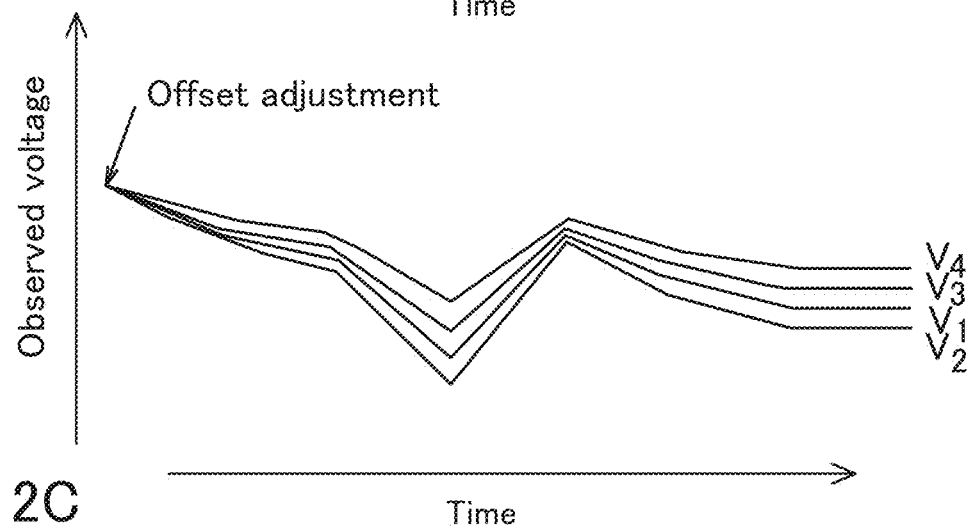

First, a plurality of (n: n is a natural number) secondary batteries are subjected to monitoring. Data on elapsed time and observed voltages of the secondary batteries are acquired and sequentially stored in a memory device or the like. For example, as shown in FIG. 2(A), graphs of four secondary batteries are sequentially obtained with the horizontal axis representing the observed voltage and the vertical axis representing time. Then, as shown in FIG. 2(B), offset adjustment is performed in order that the measurement of each secondary battery starts at the same time.

Figure 2C:
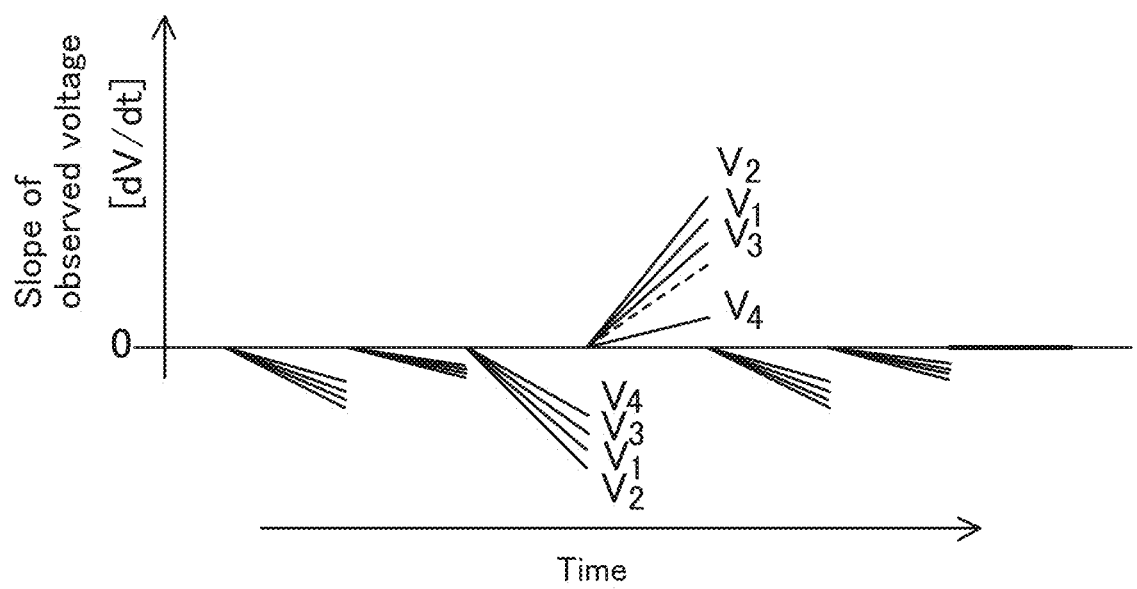

Then, the slope of the observed voltage per unit time is calculated at given intervals. FIG. 2(C) shows a line segment of each slope for easy understanding of a difference in the correlation. In FIG. 2(C), the slope of a voltage $V_4$ of a fourth secondary battery has a poor correlation with the slopes of the other secondary batteries. The dotted line in FIG. 2(C) shows the result obtained when the correlation between the slope of the voltage $V_4$ of the secondary battery and the slopes of the other secondary batteries is maintained.

The amount of change in observed voltage can be calculated based on Formula 1.

$$(k)=V_n(k)-V_n(k-1) \text{[Formula 1]}$$

The above formula is a state equation that expresses the transition of the state. Note that k is an integer that represents the number of a calculation cycle in a processing period for calculating one correction value; for example, k=0, 1, 2, 3, or 4.

Then, it is determined whether the observed voltage signal is sufficiently large with respect to observed noise. Whether the amount of change in a first secondary battery is larger than a threshold value is determined based on Formula 2 below.

$$|\Delta V_1(k)|>c\times V_{th} \text{[Formula 2]}$$

Whether the amount of change in an n-th secondary battery is larger than the threshold value is determined based on Formula 3 below.

$$|\Delta V_n(k)|>c\times V_{th} \text{[Formula 3]}$$

In the case where the amount of change is larger than the threshold value, whether the variation width is within an expected range is determined, and if it is beyond the expected range, abnormality occurrence is notified. When the variation width is within the range, the coefficient of a subsequent cycle (k+1) is updated.

Figure 3A:
FIGS. 3 (A) and (B) are block diagrams showing one embodiment of the present invention.

The variation width is determined based on Formula 4 below. Note that an can be inferred by a reference parameter acquisition system shown in FIG. 3(A), which uses an (infinite Impulse Response) filter or an FIR (finite Impulse Response) filter.

$$\widehat{a_n} - R_{th} < \frac{\Delta V_n(k)}{\Delta V_1(k)} \text{[Formula 4]}$$

A circumflex over a letter means that the value represented by the letter is an estimated value.

$$\frac{\Delta V_n(k)}{\Delta V_1(k)} < \widehat{a_n} + R_{th} \text{[Formula 5]}$$

Under the conditions satisfying Formula 4 and Formula 5, the coefficient of the subsequent cycle (k+1) is updated.

In the case where Formula 4 and Formula 5 are not satisfied, abnormality is determined to occur and a user is notified, for example. Note that Formula 4 and Formula 5 may be one formula though they are separated in this example.

Figure 3B:
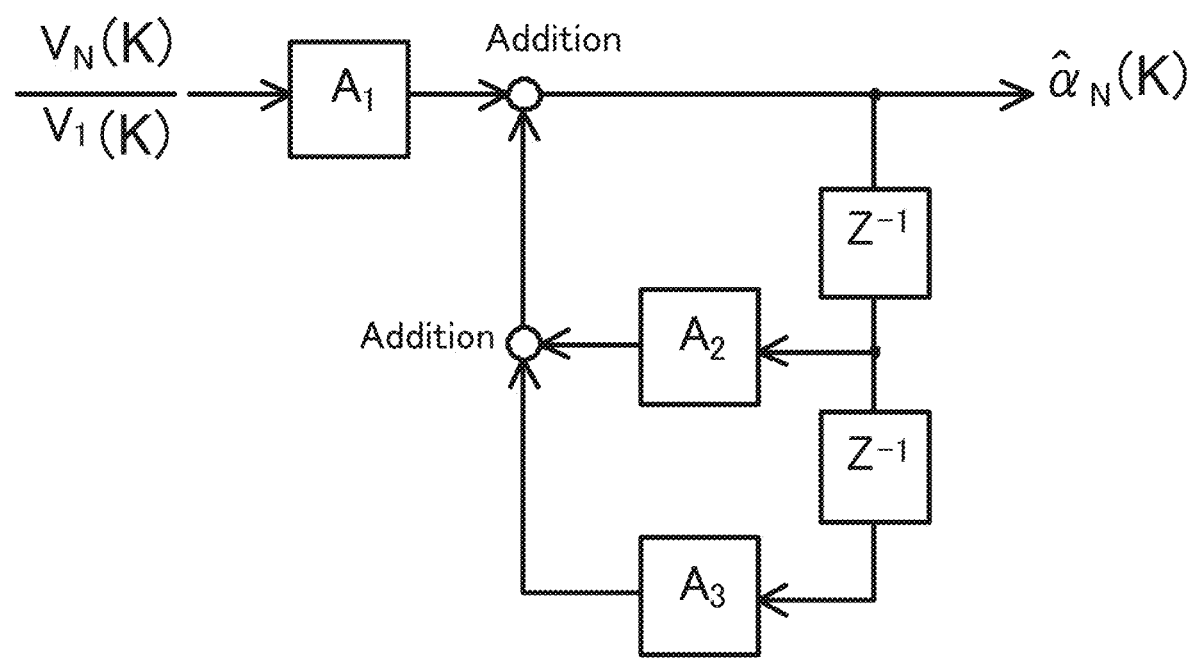
Figure 4:
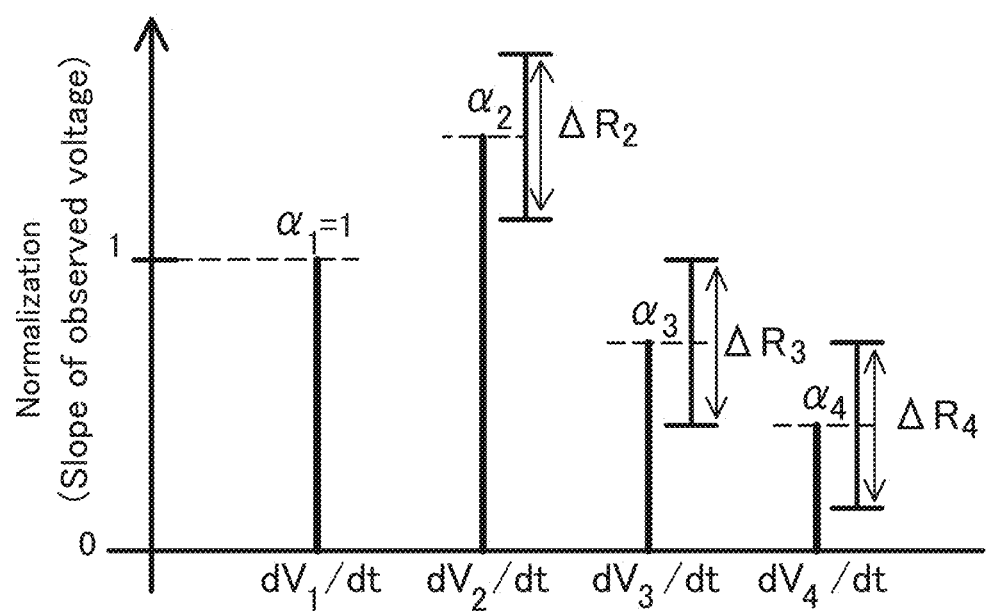
FIG. 4 A graph showing voltage data of one embodiment of the present invention.

The abnormality detection method is not limited to the above and a normalization method with the slope of the voltage of a given battery may be used. Abnormality may be detected by utilizing the relative relationship shown as an example in FIG. 4. The relative relationship between the slopes of voltages of batteries without abnormality is regarded as a reference parameter ($\alpha_2$, $\alpha_3$, or $\alpha_4$) and a battery may be determined to be abnormal when deviating from the range of variations ($\Delta R_2$, $\Delta R_3$, or $\Delta R_4$) in the characteristics of batteries. FIG. 3(B) shows a diagram of a system that acquires the reference parameters ($\alpha_2$, $\alpha_3$, and $\alpha_4$) using feedback control.

When the behavior of a plurality of secondary batteries, i.e., the slope of the observed voltage per unit time is monitored, a secondary battery that behaves differently from the other secondary batteries can be found, so that abnormality can be detected. Thus, abnormality detection is possible without using a complicated calculation such as a Kalman filter. In addition, the amount of calculation for SOC estimation can be reduced, allowing highly accurate estimation of the charge state. Furthermore, SOC estimation and abnormality detection can be performed at low costs by a small-scaled circuit configuration without using a Kalman filter. Even when the degradation of secondary batteries proceeds with repeated charge and discharge, all the secondary batteries receive almost the same stress and degrade almost similarly; hence, the above method enables abnormality to be detected in consideration of the degradation of the secondary batteries.

Embodiment 2

In this embodiment, an example in which a battery state estimation device is used in an electric vehicle (EV) is described with reference to FIG. 5(A).

In an electric vehicle, a first secondary battery 301 as a secondary battery for main driving and a second secondary battery 311 that supplies electric power to an inverter 312 starting a motor 304 are provided. In this embodiment, a state estimation unit 300 driven by power source of the second secondary battery 311 monitors a plurality of secondary batteries constituting the first secondary battery 301 collectively. The state estimation unit 300 estimates a charge state or detects abnormality. The state estimation unit 300 can also be referred to as an abnormality detection unit in the case where abnormality detection is performed. An entire device including the abnormality detection unit is also referred to as an abnormality detection device. The abnormality detection device preferably uses a small-scaled circuit configuration so as to reduce the cost of hardware and the cost of calculation.

The main component of the state estimation unit 300 is a computer including a CPU (Central Processing Unit), a memory as a storage unit, and the like. The CPU includes arithmetic units corresponding to the respective secondary batteries. The arithmetic units quantify the correlation between the secondary batteries. Threshold value data is stored in the memory and an SOC is estimated from an input current value or voltage value. In the case where the cost of hardware and the cost of calculation are reduced by a small-scaled circuit configuration, the state estimation unit 300 preferably uses a microcomputer. The microcomputer refers to a small computer constituted by a microprocessor, a memory, a peripheral chip, and the like. The state estimation unit 300 can also use a microcontroller. The microcontroller includes a silicon substrate where a processor, a memory, and a peripheral circuit are integrated into a core integrated circuit (IC) chip.

The slope of the voltage of a given battery is normalized in order to quantify the correlation. The slope of the voltage of a battery largely depends on the internal impedance. On the basis of the relative relationship between the slopes of voltages of batteries, a battery is determined to be abnormal when deviating from the range of variations in the characteristics of batteries.

The relative relationship between the slopes of voltages of batteries acquires a reference parameter using feedback control. In comparison with the threshold value determined on the basis of the reference parameter, an observed signal with the observed voltage having a slope less than or equal to the threshold value is regarded as a noise and the battery is determined to be normal. In the case where the observed voltage has a slope significantly different from the threshold value and beyond an expected range, the battery is determined to be abnormal. The coefficient is updated on the basis of data of the secondary battery determined to be normal and feedback is provided.

The first secondary battery 301 mainly supplies electric power to in-vehicle parts for a 42-V system (for a high-voltage system) and the second secondary battery 311 supplies electric power to in-vehicle parts for a 14-V system (for a low-voltage system). As the second secondary battery 311, a lead-acid battery is often adopted because it is advantageous in cost. Lead-acid batteries have disadvantages compared with lithium-ion secondary batteries in that they have a larger amount of self-discharge and are more likely to degrade due to a phenomenon called sulfation. An advantage of using a lithium-ion secondary battery as the second secondary battery 311 is eliminating the need for maintenance; however, when the lithium-ion secondary battery is used over a long time, for example three years or longer, abnormalities that cannot be determined at the time of fabricating the battery might occur. In particular, when the second secondary battery 311 that starts the inverter becomes inoperative, the motor cannot be started even when the first secondary battery 301 has remaining capacity; thus, in order to prevent this, in the case where the second secondary battery 311 is a lead-acid battery, the second secondary battery is supplied with electric power from the first secondary battery to constantly maintain a fully-charged state.

This embodiment shows an example in which lithium-ion secondary batteries are used as both the first secondary battery 301 and the second secondary battery 311. A lead-acid battery or an all-solid-state battery may be used as the second secondary battery 311.

Regenerative energy generated by rolling of tires 316 is transmitted to the motor 304 through a gear 305 and a motor controller 303 and a battery controller 302 charge the second secondary battery 311 or the first secondary battery 301.

The first secondary battery 301 is mainly used to rotate the motor 304 and supplies electric power to in-vehicle parts for a 42-V system (such as an electric power steering 307, a heater 308, and a defogger 309) through a DC-DC circuit 306. Even in the case where there is a rear motor for the rear wheels, the first secondary battery 301 is used to rotate the rear motor.

The second secondary battery 311 supplies electric power to in-vehicle parts for a 14-V system (such as a stereo, a power window 314, and lamps 315) through a DC-DC circuit 310.

The first secondary battery 301 is composed of a plurality of secondary batteries. For example, a cylindrical secondary battery 600 is used. As shown in FIG. 5(B), the cylindrical secondary battery 600 may be interposed between a conductive plate 613 and a conductive plate 614 to form a module 615. In FIG. 5(B), switches are not illustrated between the secondary batteries. A plurality of secondary batteries 600 may be connected in parallel, connected in series, or connected in series after being connected in parallel. By forming the module 615 including the plurality of secondary batteries 600, large electric power can be extracted.

Figure 5A:
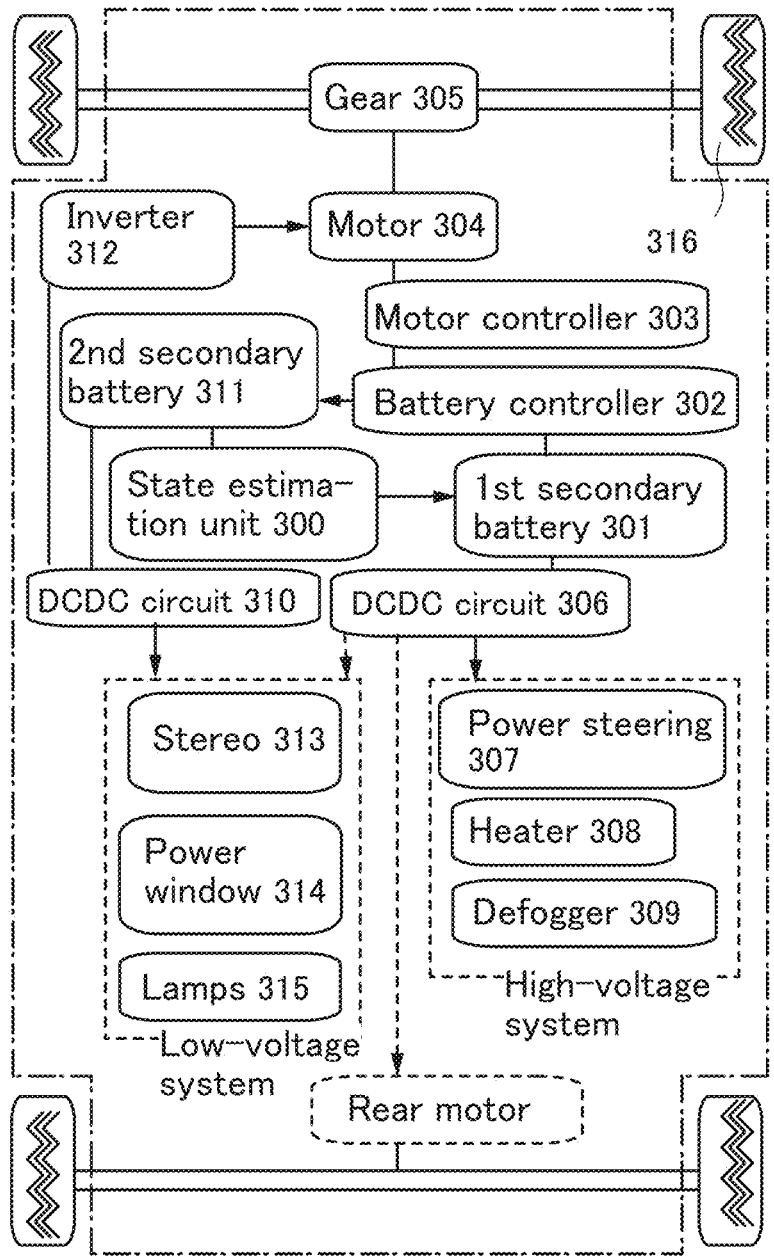
FIG. 5 A block diagram showing one embodiment of the present invention.
Figure 5B:
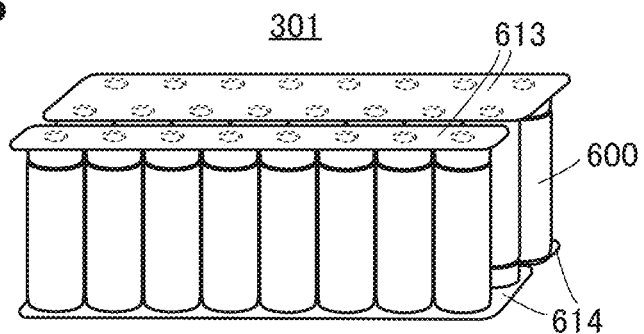

In FIG. 5(A), the battery controller 302 and the state estimation unit 300 are illustrated to have separate configurations, but without particularly limited thereto, they may be configured with a plurality of IC chips on the same substrate or collectively configured as one unit. The state estimation unit 300 may be configured with LSI (Large Scale Integration) integrally fabricated on one chip. The technique of circuit integration is not limited to LSI, and circuit integration may be implemented by a dedicated circuit or a general-purpose processor. An 8-bit, 16-bit, 32-bit, 64-bit, or 128-bit processor may be used as the processor, for example. Examples of the processor include a microprocessor, a co-processor, and a floating-point processor. It is also possible to use an FPGA (Field Programmable Gate Array) that is programmable after LSI fabrication, or a reconfigurable processor that is capable of reconfiguring connections and settings of circuit cells inside the LSI. The battery controller 302 is also referred to as a BMU (battery management unit) in some cases. The reference parameter is stored in, for example, a memory in the state estimation unit 300 of the secondary battery, specifically, a ROM (Read Only Memory) or a RAM (Random Access Memory). The state estimation unit 300 can calculate the SOC of the secondary battery more accurately.

A power storage management device or control device including the state estimation unit 300 of a secondary battery can be achieved. It is also possible to achieve a power storage management method in which a plurality of processes including neural network processing are executed sequentially to constitute a plurality of steps. It is also possible to achieve a computer program in which a computer executes each step included in the power storage management method. In addition, such a computer program can be stored in a storage medium or a cloud via an Internet communication network and executed.

This embodiment can be freely combined with Embodiment 1.

Embodiment 3

Figure 6A:
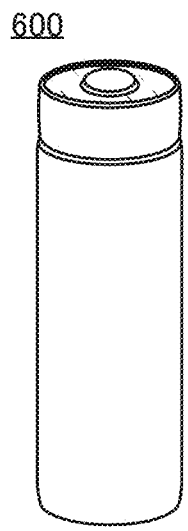
FIGS. 6 (A) and (B) are perspective views showing an example of a secondary battery, and (C) is a cross-sectional model diagram showing a direction in which electrons move or current flows in charging of a secondary battery.

An example of a cylindrical secondary battery is described with reference to FIG. 6(A) and FIG. 6(B). A cylindrical secondary battery 600 includes, as shown in FIG. 6(A), a positive electrode cap (battery lid) 601 on the top surface and a battery can (outer can) 602 on the side and bottom surfaces. The positive electrode cap and the battery can (outer can) 602 are insulated by a gasket (insulating packing) 610.

Figure 6B:
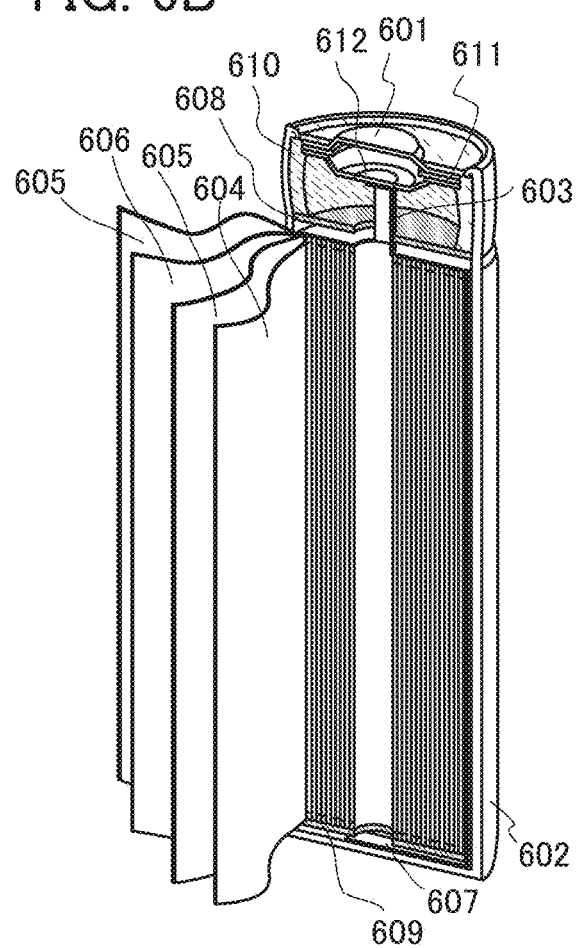

FIG. 6(B) shows a schematic cross-sectional view of the cylindrical secondary battery. Inside the battery can 602 having a hollow cylindrical shape, a battery element in which a belt-like positive electrode 604 and a belt-like negative electrode 606 are wound with a separator 605 located therebetween is provided, Although not illustrated, the battery element is wound around a center pin. One end of the battery can 602 is closed and the other end thereof is opened. For the battery can 602, a metal having corrosion resistance to an electrolyte solution, such as nickel, aluminum, or titanium, an alloy of such a metal, or an alloy of such a metal and another metal (e.g., stainless steel or the like) can be used. The battery can 602 is preferably covered with nickel, aluminum, or the like to prevent corrosion due to an electrolyte solution, Inside the battery can 602, the battery element in which the positive electrode, the negative electrode, and the separator are wound is interposed between a pair of insulating plates 608 and 609 that face each other. Furthermore, a nonaqueous electrolyte solution (not illustrated) is injected inside the battery can 602 provided with the battery element. The secondary battery is composed of a positive electrode containing an active material such as lithium cobalt oxide ($LiCoO_2$) or lithium iron phosphate ($LiFePO_4$), a negative electrode composed of a carbon material such as graphite capable of occluding and releasing lithium ions, a nonaqueous electrolytic solution in which an electrolyte composed of a lithium salt such as $LiBF_4$ or $LiPF_6$ is dissolved in an organic solvent such as ethylene carbonate or diethyl carbonate, and the like.

Since a positive electrode and a negative electrode that are used for a cylindrical storage battery are wound, active materials are preferably formed on both surfaces of a current collector. A positive electrode terminal (positive electrode current collector lead) 603 is connected to the positive electrode 604, and a negative electrode terminal (negative electrode current collector lead) 607 is connected to the negative electrode 606. For both the positive electrode terminal 603 and the negative electrode terminal 607, a metal material such as aluminum can be used. The positive electrode terminal 603 and the negative electrode terminal 607 are resistance-welded to a safety valve mechanism 612 and the bottom of the battery can 602, respectively. The safety valve mechanism 612 is electrically connected to the positive electrode cap 601 through a PTC element (Positive Temperature Coefficient) 611. The safety valve mechanism 612 cuts off electrical connection between the positive electrode cap 601 and the positive electrode 604 when the internal pressure of the battery exceeds a predetermined threshold value. In addition, the PTC element 611 is a thermally sensitive resistor whose resistance increases as temperature rises, and limits the amount of current by increasing the resistance to prevent abnormal heat generation. Barium titanate ($BaTiO_3$)-based semiconductor ceramics or the like can be used for the PTC element.

A lithium-ion secondary battery using an electrolyte solution includes a positive electrode, a negative electrode, a separator, an electrolyte solution, and an exterior body. Note that in a lithium-ion secondary battery, the anode and the cathode are interchanged in charging and discharging, and the oxidation reaction and the reduction reaction are interchanged; thus, an electrode with a high reaction potential is called the positive electrode and an electrode with a low reaction potential is called the negative electrode. For this reason, in this specification, the positive electrode is referred to as a "positive electrode" or a "+ electrode (plus electrode)" and the negative electrode is referred to as a "negative electrode" or a "− electrode (minus electrode)" in any of the case where charging is performed, the case where discharging is performed, the case where a reverse pulse current is made to flow, and the case where charging current is made to flow. The use of terms anode and cathode related to the oxidation reaction and the reduction reaction might cause confusion because the anode and the cathode are reversed in charging and in discharging. Thus, the terms anode and cathode are not used in this specification. If the term anode or cathode is used, it should be clearly mentioned whether the anode or the cathode is in charging or discharging and corresponds to the positive electrode (plus electrode) or the negative electrode (minus electrode).

Figure 6C:
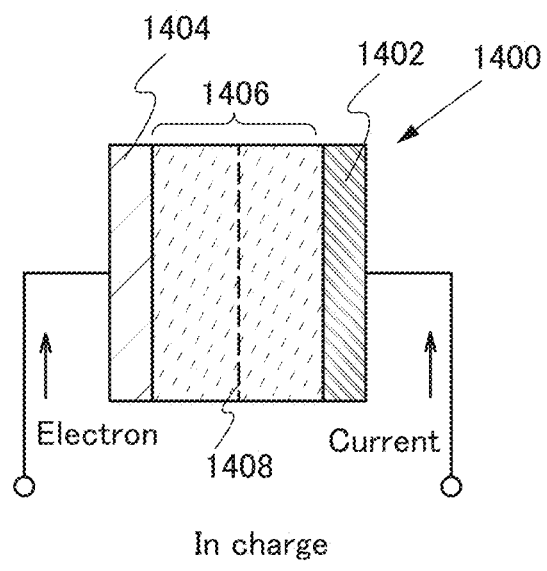

A charger is connected to two terminals shown in FIG. 6(C), and a storage battery 1400 is charged. As the charge of the storage battery 1400 proceeds, a potential difference between electrodes increases. The positive direction in FIG. 6(C) is the direction which a current flows from a terminal outside the storage battery 1400 to a positive electrode 1402; from the positive electrode 1402 to a negative electrode 1404 in the storage battery 1400; and from the negative electrode to a terminal outside the storage battery 1400. In other words, the direction in which a charge current flows is regarded as the direction of a current. In FIG. 6(C), the storage battery 1400 includes a separator 1408 and an electrolyte solution 1406.

In this embodiment, an example of a lithium-ion secondary battery is shown; however, without limitation to a lithium-ion secondary battery, a material including an element A, an element X, and oxygen can be used as a positive electrode material for the secondary battery. The element A is preferably one or more selected from the Group 1 elements and the Group 2 elements. As a Group 1 element, for example, an alkali metal such as lithium, sodium, or potassium can be used. As a Group 2 element, for example, calcium, beryllium, magnesium, or the like can be used. As the element X, for example, one or more selected from metal elements, silicon, and phosphorus can be used. The element X is preferably one or more selected from cobalt, nickel, manganese, iron, and vanadium. Typical examples include lithium-cobalt composite oxide ($LiCoO_2$) and lithium iron phosphate ($LiFePO_4$).

The negative electrode includes a negative electrode active material layer and a negative electrode current collector In addition, the negative electrode active material layer may contain a conductive additive and a binder.

For the negative electrode active material, an element that enables a charge-discharge reaction by alloying and dealloying reactions with lithium can be used. For example, a material containing at least one of silicon, tin, gallium, aluminum, germanium, lead, antimony, bismuth, silver, zinc, cadmium, indium, and the like can be used. Such elements have higher capacity than carbon, and silicon in particular has a high theoretical capacity of 4200 mAh/g.

In addition, the secondary battery preferably includes a separator. As the separator, for example, a fiber containing cellulose such as paper; nonwoven fabric; a glass fiber; ceramics; a synthetic fiber using nylon (polyamide), vinylon (polyvinyl alcohol-based fiber), polyester, acrylic, polyolefin, or polyurethane; or the like can be used.

Figure 7A:
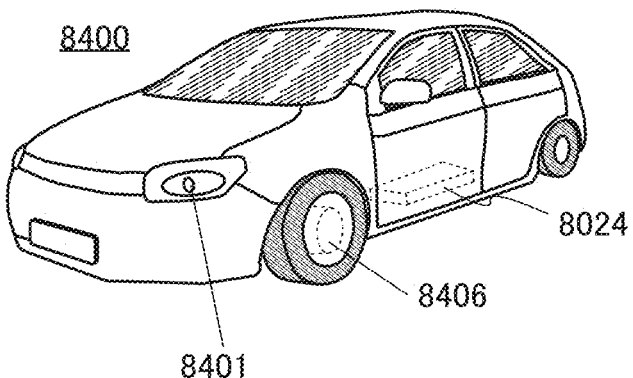
FIGS. 7 (A), (B), and (C) are perspective views showing examples of moving objects.

FIG. 7 shows examples of vehicles using a charge state estimation device of a secondary battery of one embodiment of the present invention. A secondary battery 8024 of an automobile 8400 shown in FIG. 7(A) not only drives an electric motor 8406 but also can supply electric power to a light-emitting device such as a headlight 8401 or a room light (not illustrated). For the secondary battery 8024 in the automobile 8400, the module 615 in which the cylindrical secondary battery 600 shown in FIG. 6(B) is interposed between the conductive plate 613 and the conductive plate 614 can be used.

Figure 7B:
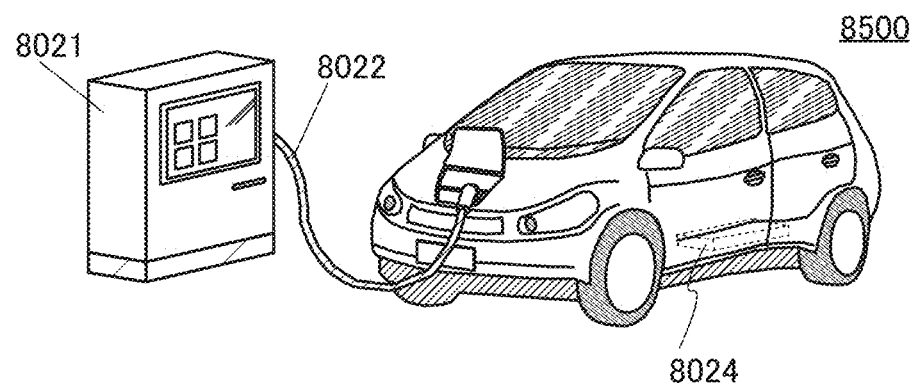

An automobile 8500 shown in FIG. 7(B) can be charged when a secondary battery included in the automobile 8500 is supplied with electric power through external charging equipment by a plug-in system, a contactless power feeding system, or the like. FIG. 7(B) shows a state where the secondary battery 8024 incorporated in the automobile 8500 is charged from a ground installation type charging device 8021 through a cable 8022. Charging may be performed as appropriate by a given method such as CHAdeMO (registered trademark) or Combined Charging System as a charging method, the standard of a connector, or the like. The charging device 8021 may be a charging station provided in a commerce facility or a power source in a house. For example, with a plug-in technique, the secondary battery 8024 incorporated in the automobile 8500 can be charged by power supply from the outside. Charging can be performed by converting AC electric power into DC electric power through a converter such as an ACDC converter.

Although not illustrated, a power receiving device can be incorporated in the vehicle, and the vehicle can be charged by being supplied with electric power from an above-ground power transmitting device in a contactless manner. In the case of this contactless power feeding system, by incorporating a power transmitting device in a road or an exterior wall, charging can also be performed while the vehicle is driven without limitation on the period while the vehicle is stopped. In addition, this contactless power feeding system may be utilized to transmit and receive electric power between vehicles. Furthermore, a solar cell may be provided in the exterior of the vehicle to charge the secondary battery while the vehicle is stopped or while the vehicle is driven. For supply of electric power in such a contactless manner, an electromagnetic induction method or a magnetic resonance method can be used.

Figure 7C:
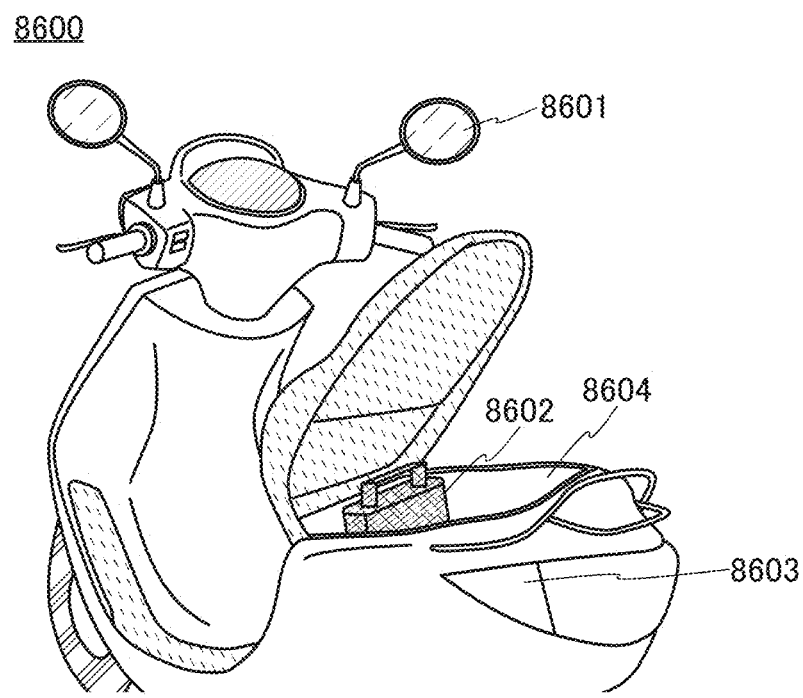

FIG. 7(C) is an example of a motorcycle using the charge state estimation device of a secondary battery of one embodiment of the present invention. A scooter 8600 shown in FIG. 7(C) includes a secondary battery 8602, side mirrors 8601, and direction indicators 8603. The secondary battery 8602 can supply electricity to the direction indicators 8603.

In the scooter 8600 shown in FIG. 7(C), the secondary battery 8602 can be stored in an under-seat storage 8604. The secondary battery 8602 can be stored in the under-seat storage 8604 even when the under-seat storage 8604 is small.

This embodiment can be combined with any of the other embodiments as appropriate.

Embodiment 4

The abnormality detection device of a secondary battery of one embodiment of the present invention can be applied to a device including a secondary battery and a wireless module, not being limited to a vehicle.

FIG. 8(A) shows an example of a mobile phone. A mobile phone 7400 includes operation buttons 7403, an external connection port 7404, a speaker 7405, a microphone 7406, and the like in addition to a display portion 7402 incorporated in a housing 7401. Note that the mobile phone 7400 includes a power storage device 7407 and an abnormality detection device of the power storage device 7407. Even if a wireless module for transmitting and receiving data and the power storage device 7407 are positioned close to each other, abnormality can be detected by the abnormality detection method described in the above embodiment.

FIG. 8(B) is a projection diagram showing an example of an external view of an information processing device 200. The information processing device 200 described in this embodiment includes an arithmetic device 210, display portions 230 and 240, a power storage device 250, and an abnormality detection device.

The information processing device 200 includes a communication portion that can potentially be a noise source, and a wireless module has a function of supplying information to a network and obtaining information from a network. Information distributed in a specific area can be received using the communication portion and image information can be generated based on the received information. The information processing device 200 can function as a personal computer when either the display portion 230 or 240 is set as a touch input panel including a screen where a keyboard is displayed.

The abnormality detection device of a secondary battery of one embodiment of the present invention can be incorporated in a wearable device shown in FIG. 8(C), allowing abnormality detection.

For example, the abnormality detection device can be incorporated in a glasses-type device 400 shown in FIG. 8(C), The glasses-type device 400 includes a frame 400a, a display portion 400b, and a wireless module. Since abnormality detection can be performed even when a power storage device, the abnormality detection device, and the wireless module are positioned close to each other in a temple portion of the frame 400a with curvature, the glasses-type device 400 can be a safe device capable of detecting abnormal occurrence in the power storage device.

A power storage device, the abnormality detection device, and a wireless module can be incorporated in a headset-type device 401. The headset-type device 401 includes at least a microphone portion 401a, a flexible pipe 401b, and an earphone portion 401c. The power storage device, the abnormality detection device, and the wireless module can be provided in the flexible pipe 401b or the earphone portion 401c.

The abnormality detection device can also be incorporated in a device 402 that can be directly attached to a human body. A power storage device 402b and the abnormality detection device of the power storage device can be provided in a thin housing 402a of the device 402.

The abnormality detection device can also be incorporated in a device 403 that can be attached to clothing. A power storage device 403b and the abnormality detection device of the power storage device can be provided in a thin housing 403a of the device 403.

The abnormality detection device can also be incorporated in a watch-type device 405. The watch-type device 405 includes a display portion 405a and a belt portion 405b, and a power storage device and the abnormality detection device of the power storage device can be provided in the display portion 405a or the belt portion 405b.

The display portion 405a can display various kinds of information such as reception information of an e-mail or an incoming call in addition to time.

Since the watch-type device 405 is a type of wearable device that is directly wrapped around an arm, a sensor that measures the pulse, blood pressure, or the like of a user can be incorporated therein. Data on the exercise quantity and health of the user can be accumulated to be used for health maintenance.

A power storage device and the abnormality detection device of the power storage device can be incorporated in a belt-type device 406. The belt-type device 406 includes a belt portion 406a and a wireless power-feeding/power-receiving portion 406b, and a power storage device, the abnormality detection device, and a wireless module can be incorporated in the belt-portion 406a.

By using the power storage device and the abnormality detection device of the power storage device of one embodiment of the present invention as a power storage device of a daily electronic product, a light and safe product can be provided. Examples of the daily electronic product include an electric toothbrush, an electric shaver, and electric beauty equipment. As power storage devices of these products, small and lightweight power storage devices with stick-like shapes and high capacity are desired in consideration of handling ease for users. FIG. 8(D) is a perspective view of a device called a vaporizer (electronic cigarette). In FIG. 8(D), an electronic cigarette 7410 is composed of an atomizer 7411 including a heating element, a power storage device 7414 that supplies electric power to the atomizer, and a cartridge 7412 including a liquid supply bottle, a sensor, and the like. To improve safety, the abnormality detection device of a power storage device may be electrically connected to the power storage device 7414. The power storage device 7414 shown in FIG. 8(D) includes an external terminal for connection to a charger. When the electronic cigarette is held, the power storage device 7414 becomes a tip portion; thus, it is desirable that the power storage device 7414 have a short total length and a light weight.

Note that this embodiment can be combined with any of the other embodiments as appropriate.

Example 1

Figure 9A:
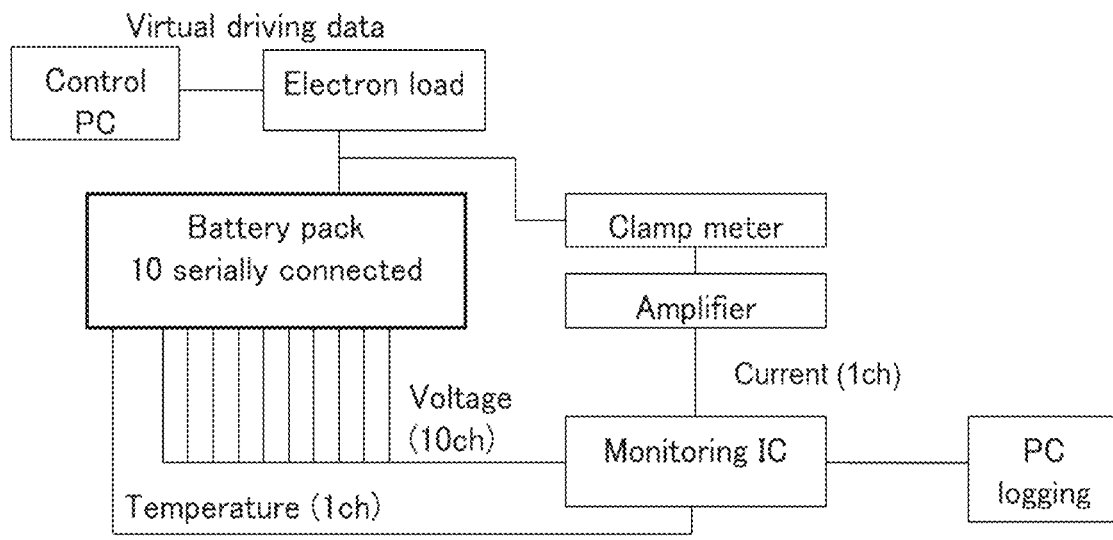
FIG. 9 (A) is a block diagram showing a configuration of Example and (B) is a graph showing an example of data.

FIG. 9(A) shows an experimental device for verifying whether a micro-short circuit can be detected from the amount of change in the voltage of a secondary battery, FIG. 9(A) includes 10 secondary batteries connected in series, a control PC storing virtual driving data, an electron load device, a monitoring IC, and a PC for storing logging data. Current is measured with a clamp meter. The monitoring IC monitors current, voltage, and temperature.

Among the 10 secondary batteries connected in series, three secondary batteries are detected to be abnormal from the difference between the slopes of the secondary batteries. An electric power resistor is inserted in parallel to each of No. 1, No. 2, and No. 10, thereby generating a pseudo micro-short circuit several times. The amount of change in the voltage (also referred to as the slope) of each of the 10 secondary batteries connected in series is obtained. In this example, determination is performed at a sampling interval of 0.11 sec.

No. 4 is selected as a reference secondary battery for comparison, and the difference between the amount of change in the voltage of No. 4 and the average amount of change in the voltage of each secondary battery is calculated to be used as criteria. The range of the amount of change in voltage differs between each secondary battery because of a difference in internal resistance. Hence, the difference is corrected on the basis of any given secondary battery.

Figure 9B:
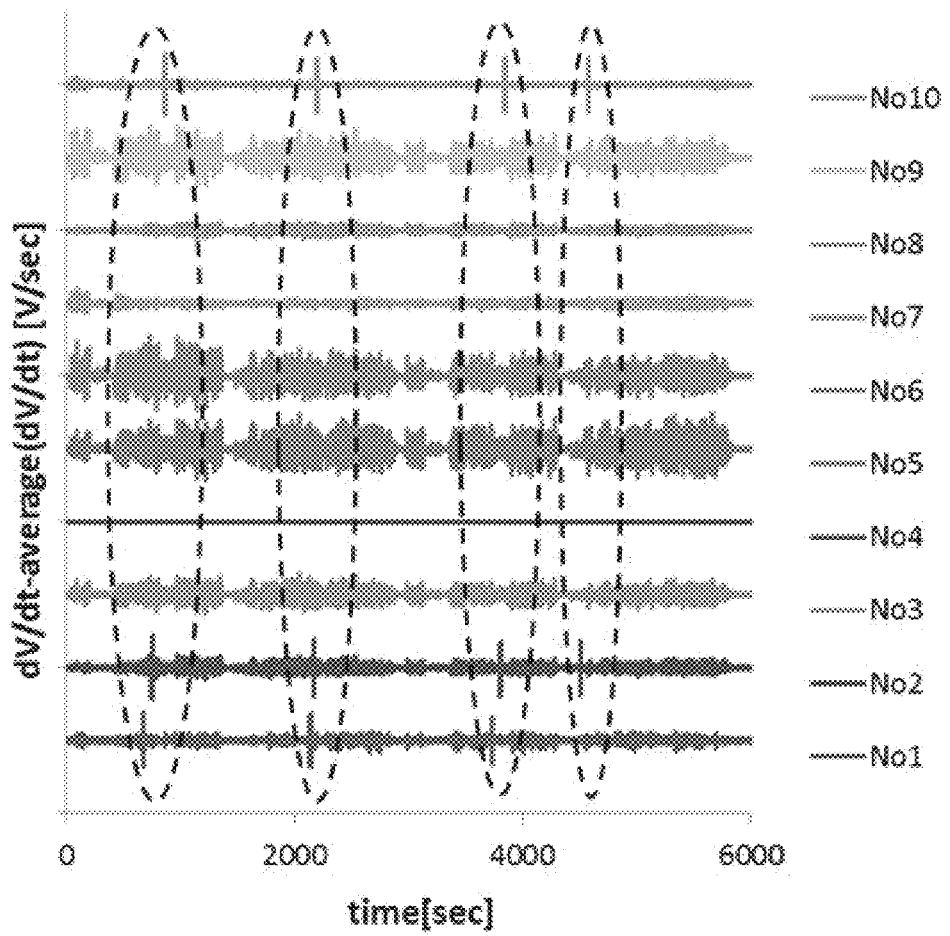

FIG. 9(B) shows data where the vertical axis represents the amount of change in voltage and the horizontal axis represents time. For comparison of data, ten pieces of data that actually overlap are shown apart from each other at intervals in the vertical axis direction. In FIG. 9, outstanding peaks are found in data of each of Nos. 1, 3, and 10 where a micro-short circuit is generated. The outstanding peaks are abnormal points each having an amplitude of approximately 0.2 (V; Sec). A micro-short circuit can be probably detected when the threshold value is determined on the basis of the values of the outstanding peaks.

As the result of such verification using data, abnormality detection can be performed without using a Kalman filter or the like. Since abnormality can be detected by calculating the amount of change in the voltage of each secondary battery, arithmetic operation is possible with an approximately 8-bit CPU in this example using the 10 secondary batteries connected in series. In this example, the 10 serially connected secondary batteries are described as an example; the threshold value can be determined as appropriate because the amount of change in voltage or the like differs with the number and the type of secondary batteries used. In order to perform abnormality detection highly accurately, data is preferably corrected as appropriate to set the optimal threshold value.

REFERENCE NUMERALS

200: information processing device, 210: arithmetic device, 220: input/output device, 230: display portion, 240: display portion, 250: power storage device, 290: communication portion, 300: state estimation unit, 301: secondary battery, 302: battery controller, 303: motor controller, 304: motor, 305: gear, 306: DC-DC circuit, 307: electric power steering, 308: heater, 309: defogger, 310: DC-DC circuit, 311: secondary battery, 312: inverter, 314: power window, 315: lamps, 316: tire, 400: glasses-type device, 400a: frame, 400b: display portion, 401: headset-type device, 401a: microphone portion, 401b: flexible pipe, 401c: earphone portion, 402: device, 402a: housing, 402b: power storage device, 403: device, 403a: housing, 403b: power storage device, 405: watch-type device, 405a: display portion, 405b: belt portion, 406: belt-type device, 406a: belt portion, 406b: wireless power-feeding/power-receiving portion, 600: secondary battery, 601: positive electrode cap, 602: battery can, 603: positive electrode terminal, 604: positive electrode, 605: separator, 606: negative electrode, 607: negative electrode terminal, 608: insulating plate, 609: insulating plate, 611: PTC element, 612: safety valve mechanism, 613: conductive plate, 614: conductive plate, 615: module, 1400: storage battery, 1402: positive electrode, 1404: negative electrode, 1406: electrolyte solution, 1408: separator, 7400: mobile phone, 7401: housing, 7402: display portion, 7403: operation button, 7404: external connection port, 7405: speaker, 7406: microphone, 7407: power storage device, 7410: electronic cigarette, 7411: atomizer, 7412: cartridge, 7414: power storage device, 8021: charging device, 8022: cable, 8024: secondary battery, 8400: automobile, 8401: headlight, 8406: electric motor, 8500: automobile, 8600: scooter, 8601: side mirror, 8602: secondary battery, 8603: direction indicator, 8604: under-seat storage

The invention claimed is:

1. An abnormality detection method of a power storage device, comprising the steps of:
   measuring a voltage of each of a plurality of secondary batteries connected in series with a voltage monitor; and
   comparing amounts of changes in voltages of the secondary batteries per unit time, so as to determine whether a correlation among the plurality of secondary batteries is abnormal,
   wherein the correlation is determined by using a reference parameter inferred by an Infinite Impulse Response filter.

2. The abnormality detection method of a power storage device according to claim 1, wherein the secondary battery is a lithium-ion secondary battery.

3. The abnormality detection method of a power storage device according to claim 1, wherein a correlation between the amounts of changes in the voltages of the secondary batteries is normalized on the basis of a given secondary battery.

4. A management device of a power storage device, the management device comprising an abnormality detection unit,
   wherein the power storage device comprises a plurality of secondary batteries connected in series, wherein the abnormality detection unit is configured to measure a voltage of each of the plurality of secondary batteries with a voltage monitor, wherein the abnormality detection unit is configured to compare amounts of changes in voltages of the secondary batteries per unit time, so as to determine whether a correlation among the plurality of secondary batteries is abnormal, and wherein the correlation is determined by using a reference parameter inferred by an Infinite Impulse Response filter.

5. The management device according to claim 4, wherein the secondary battery is a lithium-ion secondary battery.

6. The management device according to claim 4, wherein a correlation between the amounts of changes in the voltages of the secondary batteries is normalized on the basis of a given secondary battery.

7. A management device of a power storage device, the management device comprising an abnormality detection unit, wherein the power storage device comprises a plurality of secondary batteries connected in series, wherein the abnormality detection unit is configured to measure a voltage of each of the plurality of secondary batteries with a voltage monitor, wherein the abnormality detection unit is configured to compare amounts of changes in voltages of the secondary batteries per unit time, so as to determine whether a correlation among the plurality of secondary batteries is abnormal, and wherein the correlation is determined by using a reference parameter inferred by an FIR filter.

8. The management device according to claim 7, wherein the secondary battery is a lithium-ion secondary battery.

9. The management device according to claim 7, wherein a correlation between the amounts of changes in the voltages of the secondary batteries is normalized on the basis of a given secondary battery.

* * * * *